United States Patent [19]

Ripple

[11] 4,161,230

[45] Jul. 17, 1979

[54] LOUDSPEAKER EQUIPMENT

[76] Inventor: Warren Ripple, 3345 Marko St., Sarasota, Fla. 33580

[21] Appl. No.: 886,991

[22] Filed: Mar. 16, 1978

Related U.S. Application Data

[63] Continuation of Ser. No. 687,353, May 17, 1976, abandoned, which is a continuation-in-part of Ser. No. 615,364, Sep. 22, 1975, abandoned.

[51] Int. Cl.[2] .............. H05K 5/00

[52] U.S. Cl. .............. 181/148; 181/150; 181/156; 181/199

[58] Field of Search .............. 181/199, 148, 160, 150, 181/156

[56] References Cited

U.S. PATENT DOCUMENTS

| | | | |
|---|---|---|---|
| 2,036,832 | 4/1936 | Scheldorf | 181/145 |
| 3,443,661 | 5/1969 | Van Sciver | 181/199 |
| 3,882,962 | 5/1975 | Ripple | 181/154 |
| 3,941,207 | 3/1976 | Croup | 181/199 |

*Primary Examiner*—Stephen J. Tomsky
*Attorney, Agent, or Firm*—Kenneth P. Synnestvedt

[57] ABSTRACT

Loudspeaker equipment embodying a speaker, an enclosure for the speaker which is substantially closed except for the speaker opening and which is formed of walls which are thin and therefore capable of excitation and consequent sound generating vibrations under the influence of the speaker, the speaker equipment further including a reflector surrounding the speaker enclosure and having an open front through which the speaker is exposed, the walls of the reflector being spaced from the walls of the speaker enclosure to provide a passage through which sound generated by the walls of the speaker enclosure is reflected forwardly.

5 Claims, 4 Drawing Figures

LOUDSPEAKER EQUIPMENT

CROSS REFERENCE

The present application is a continuation of application Ser. No. 687,353, filed May 19, 1976, now abandoned, which in turn was a continuation-in-part of application Ser. No. 615,364, filed Sept. 22, 1975, now abandoned.

BACKGROUND AND STATEMENT OF OBJECTS

The present invention is concerned with speaker equipment, particularly equipment comprising a speaker of the well known cone type, and the invention is especially concerned with certain mounting, enclosing and sound reflecting devices for such speakers.

In my prior application above identified, the speaker itself is mounted in an enclosure having a chamber of relatively small total volume and which is also characterized by the provision of intercommunicating front and rear chamber compartments, the front compartment having a panel with an opening through which the speaker is exposed, which front compartment is of relatively large volume, as compared with the rear compartment. The enclosure walls of a speaker according to said prior application are formed of relatively thin sheet material, for instance plywood of the order of ⅛" in thickness, and the speaker enclosure is substantially imperforate except for the opening where the speaker is exposed. In speakers of this type, the enclosure walls themselves are excited and experience consequent sound generating vibrations under the influence of the speaker, at least at frequencies in the lower portion of the audio range.

As will further appear, in the preferred embodiment of the speaker enclosure, the forward or larger compartment of the speaker enclosure is substantially rectangular and is characterized by a dimension in the direction of the axis of the speaker which is relatively small; and the rear or smaller compartment is characterized by being configured as a relatively thin "tail" projecting rearwardly from the forward compartment. By the employment of speaker compartments as just described, tendency for development of resonant points within the enclosure is greatly diminished, so that the sound generation is relatively uniform over a broad frequency range, notwithstanding the fact that the total internal volume of the speaker enclosure is relatively small.

The principal object of the present invention is to further improve the operation of speaker equipment of the kind in which the walls of the enclosure participate in the sound generation, and especially speaker equipment embodying speaker enclosures such as referred to above and more fully described in my prior application above identified. More specifically, the present invention contemplates the provision of means for increasing the effectiveness and direction of propagation of the sound generated by the excitation and vibration of the walls of thin walled speaker enclosure.

This is accomplished in accordance with the present invention by the employment of a reflector or enclosing hood or horn for the speaker enclosure, the reflector having an opening at the front in which the speaker enclosure is received, the reflector being dimensioned in relation to the speaker enclosure so as to provide a forwardly opened passage preferably at all sides of the speaker enclosure. This reflector directs the sound generated by the walls of the speaker enclosure in the forward direction and thus into the normal listening area.

BRIEF DESCRIPTION OF THE DRAWINGS

How the foregoing objects and advantages are attained together with others which will occur to those skilled in the art will appear more fully from the following description referring to the accompanying drawings, in which.

DETAILED DESCRIPTION

Figure 2:
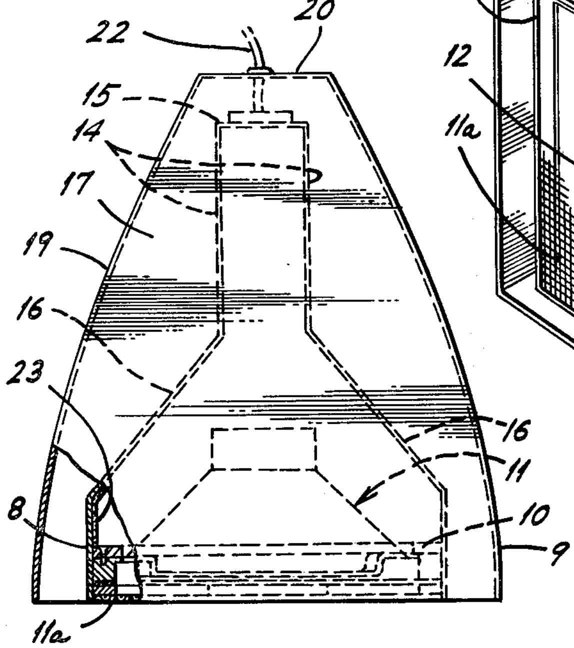
FIG. 2 is a plan view of the embodiment shown in FIG. 1, this view having a portion broken out and shown in horizontal section in order to illustrate certain of the interior parts.
Figure 1:
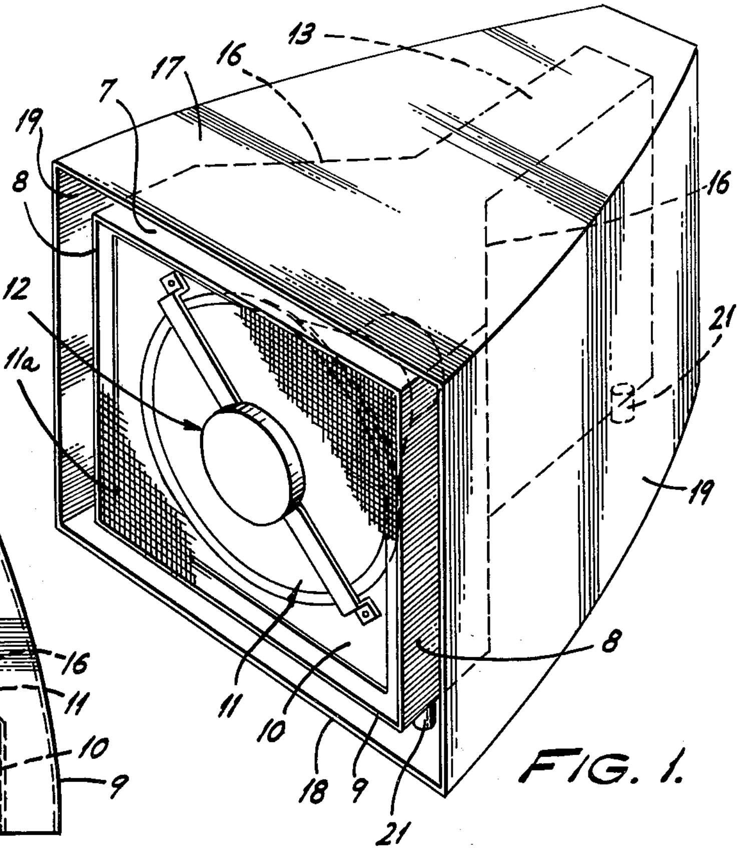
FIG. 1 is an isometric view of one embodiment of speaker equipment according to the present invention incorporting a speaker, with a surrounding speaker enclosure, and with the enclosure mounted within a reflector constructed according to the present invention.

Referring first to the embodiment shown in FIGS. 1 and 2, it will be seen that the speaker enclosure incorporates side walls such as indicated at 7, 8—8 and 9 which define the sides of a generally rectangular front compartment in which the wall 10 is mounted. This front wall is rectangular or square to fit between the walls 7, 8—8 and 9 and has a circular opening for cooperation with the speaker itself which is diagrammatically indicated at 11.

The speaker may be of single cone construction, but if desired may also include a supplemental high frequency speaker such as a cone or dome indicated at 12. The speakers are covered by an appropriate grill or cloth indicated at 11*a*.

The top and bottom walls 7 and 9 are each provided with a rearward extension, one of which appears at 13, for defining the top and bottom of the rear compartment of the speaker enclosure. Side walls 14—14 are also provided for the rear compartment, as is a rear end wall 15. The rear compartment projects rearwardly from the front compartment in the mid region thereof, and each pair of side walls 8 and 14 at the sides of the rear compartment are joined by inclined walls 16—16. It will be seen that in this embodiment the rear compartment is in the form of a "tail" having its large dimension lying in a vertical plane and extended rearwardly from the front compartment in that plane. Moreover as is shown, the rear compartment is of the same vertical dimension as the forward compartment, and the top and bottom of the rear compartment are defined by the extensions 13 of the top and bottom walls 7 and 9 of the front compartment. This configuration facilitates fabrication because of the use of a common element for defining certain corresponding walls of the front and rear compartments.

As shown in FIGS. 1 and 2, the speaker enclosure of this first embodiment is used or received within a reflector formed of flat or planar top and bottom walls 17 and 18, and a pair of curved side walls 19—19. The walls 19—19 are positioned with the convex sides presented outwardly at opposite sides of the speaker enclosure, and the side walls converge rearwardly somewhat in the manner of a horn, the rear or base end of the reflector being closed by the vertical wall 20.

Preferably the reflector is proportioned and dimensioned in relation to the corresponding dimensions of the speaker enclosure to provide clearance at all sides between the walls of the reflector and the walls of the speaker enclosure. Advantageously this clearance is of the order of one or a few inches. In a typical embodiment incorporating a speaker having a cone of 10" in diameter and with the speaker enclosure and reflector proportioned substantially as indicated in the drawings, the clearance between the walls at the top and bottom is of the order of 2", and the clearance at the opposite sides is of the order of 3" in the region of the mouth of the reflector. As will be understood, this clearance varies in different regions because of the differences in shape of the speaker and of the speaker enclosure as will be seen from examination of the plan view of FIG. 2. The speaker enclosure may be positioned within the reflector in any of a number of ways, for instance by the use of spacers, such as indicated in FIG. 1 by the reference numeral 21. Such spacers may be provided at any desired location in order to establish the desired positional relationship of the enclosure and the reflector.

It will be understood that appropriate electrical connections for feeding the signal to the speaker will be provided, for instance through the rear walls 15 and 20 of the speaker enclosure and reflector, as indicated at 22 in FIG. 2.

Certain additional structural features of the speaker enclosure and of the reflector should be noted, as follows.

First, with reference to the speaker enclosure, the walls thereof are advantageously formed of sheet material, and while certain plastics may be utilized, it is preferred to employ sheet material such as plywood. This sheet material should be quite thin, preferably less than ¼" in thickness, for instance of the order of ⅛", the walls being bonded to each other at the meeting edges by any appropriate adhesive and preferably without extensive or highly rigid reinforcement strips which would interfere with the desired participation of the enclosure walls in the sound generation.

It is also contemplated that some fibrous material, for instance thin fiber glass mat of low density be applied to the inside surfaces of the speaker enclosure walls. This is indicated in the broken out sectional part of FIG. 2 at 23. The fibrous material may be adhesively secured to the inside surfaces, and advantageously this material comprises only a relatively thin layer averaging about ¼" to ½" in thickness. Such a thin fibrous layer assists in minimizing reflection of sound waves at the high frequency end of the spectrum, without resulting in impairment of low frequency excitation of and radiation from the walls of the enclosure, and I have found that these factors assist in providing the desired participation of the enclosure itself in the radiation of sound.

The configuration of the speaker as described above and particularly the provision of the two interconnected compartments substantially differing from each other in volume, with the rear compartment in the form of what might be termed a "tail" of wide and thin shape projecting rearwardly from the front compartment, provides an enclosure which extensively participates in the sound generation, without producing sharply peaked resonant points, notwithstanding the fact that the total internal volume of the enclosure is quite small.

Typical dimensions of speaker enclosures and of the compartments thereof are generally indicated by the relationship between the size of the speaker to the size of the enclosure, as shown in the drawings. Some variation of sizes is of course useable in accordance with the invention, but general proportions of the speaker enclosure may be determined from an example such as given just below.

Thus, assuming that the cone speaker 11 of FIGS. 1 and 2 is 10" in diameter, the face panel 10 is desirably about 12" by 12". In this example the depth of the front compartment behind the face panel 10 is of the order of 4" and the junction portion defined by the inclined walls 16—16 is of the order of 5", measured in a direction perpendicular to the front wall. The length of the tail of the enclosure of this example would be of the order of 7" (extended rearwardly from the inclined walls 16—16) and the thickness of the "tail" would be about 3".

It will be understood that the dimensions referred to are given by way of example and not by way of limitation, but because of the relatively small size of the enclosure volume, the example will assist in establishing appropriate dimensions and proportions. For a smaller speaker cone, for instance an 8" speaker, proportionate reductions in the dimensions would be useable, and for a larger cone for instance, a 12" cone, proportionately larger dimensions would be useable.

With regard to the construction of the reflector, preferably the walls of the reflector are of greater thickness than those of the speaker enclosure, but the wall thickness of the reflector is not as critical as in the case of the speaker enclosure, because it is not contemplated that the reflector walls participate in the sound generation. In contrast, it is contemplated that the reflector walls serve the reflection function, somewhat in the manner of a horn. As indicated, the reflector walls are desirably thicker than the walls of the enclosure, for instance they may be ¼" thick or thicker. The joints may be made in any desired manner, as with epoxy or other adhesive bonding materials, as in the case of the walls of the enclosure. The dimensions of a typical reflector shaped in accordance with the embodiment shown in FIGS. 1 and 2 will of course depend upon the size of the speaker and speaker enclosure being employed, and with the proportions shown in the drawing and the exemplary dimensions for the speaker enclosure given hereinabove, appropriate dimensions for the reflector can readily be ascertained.

The external surfaces of the reflector may be finished or decorated in any desired manner, and it is noted that while the side walls are convexly curved, the top and bottom walls are flat and parallel, so that when used in typical living quarters, the top of the reflector may be employed in the manner of an end table or cabinet. Preferably, the interior surface of the reflector is not highly polished, and may advantageously have some type of grain or matte finish, or may even be cloth covered, in order to reduce tendency to develop resonant points at high frequencies in the audio spectrum.

Figure 3:
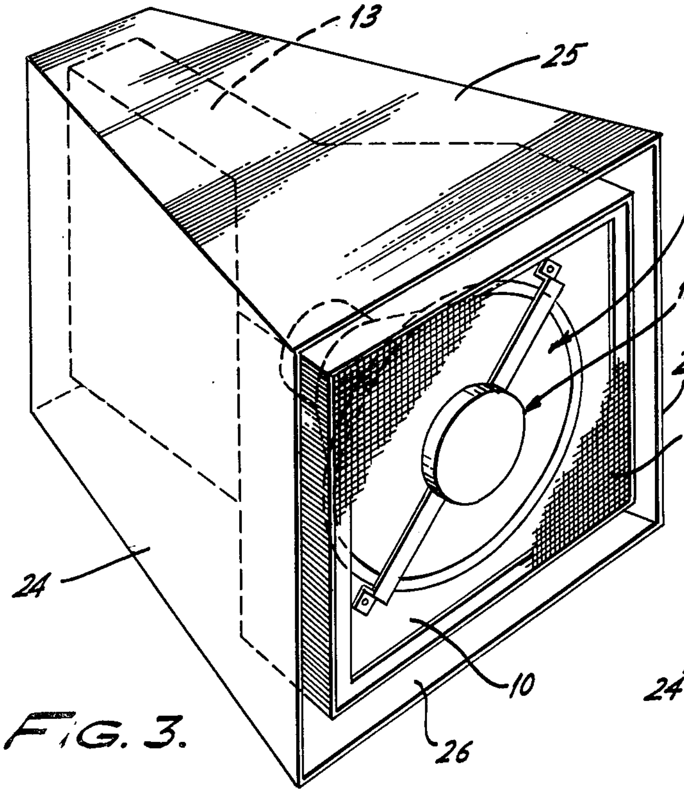
FIG. 3 is an isometric view of a second embodiment of speaker equipment according to the present invention.
Figure 4:
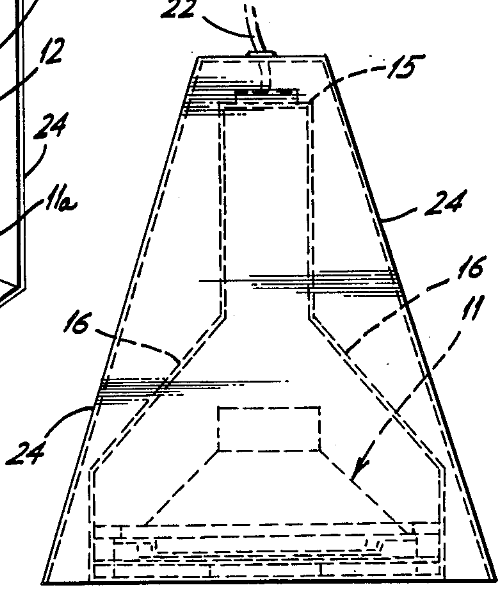
FIG. 4 is a plan view of the embodiment shown in FIG. 3.

Turning now to the embodiment shown in FIGS. 3 and 4, it will be seen that the speaker and the speaker enclosure there shown are the same as the speaker and speaker enclosure shown in FIGS. 1 and 2. However, in FIGS. 3 and 4 the reflector takes a somewhat modified shape. Here the side walls 24—24 are planar, instead of being convexly curved as in the embodiment of FIGS. 1 and 2, and the top and bottom walls 25 and 26 are of course differently shaped in order to span the space between and interconnecting the upper and lower edges of the planar side walls 24—24.

The embodiment shown in FIGS. 3 and 4 is somewhat simpler to construct and at the same time provides an effective reflector for the purposes herein contemplated.

The speaker equipment of the present invention not only provides various of the advantages referred to in my prior application above fully identified, but in addition, the use of the speaker enclosure in a reflector of the kind described and claimed in the present application provides added advantage in that sound waves generated by the walls of the speaker enclosure are directed by the reflector in the same general direction as the direction of propagation from the front face of the cone of the speaker. This is of particular advantage in stereophonic and quadrophonic installations in which it is desirable in order to attain the full benefit and effect of the stereophonic and quadrophonic reproduction, that the various waves be directed into the desired listening area.

It should be noted that the shape of the speaker enclosure, including the relative proportions of the front and rear compartments of the speaker enclosure may be varied from those illustrated herein by way of example. Thus, the rear compartment or "tail" of the speaker enclosure may be offset from the mid plane of the speaker enclosure, as in one of the embodiments illustrated in my prior application above referred to. In any event, regardless of the specific shape of the speaker enclosure, in all embodiments according to the present invention, provision is made for the placement of a speaker enclosure within a reflector, the speaker enclosure being of the type which will itself participate in the generation of the sound, the reflector being arranged to direct this portion of the generated sound. Regardless of the shape of the speaker enclosure, it is also contemplated according to the invention that the speaker enclosure be substantially imperforate except for the speaker opening.

I claim:

1. Loudspeaker equipment comprising a speaker, a speaker enclosure having enclosure walls defining a speaker chamber having front and rear intercommunicating compartments, the front compartment being generally rectangular and having a rectangular front wall with an opening therein with the speaker mounted thereon and exposed through the opening, the side walls of the front compartment defining a generally rectangular compartment space, the rear compartment having one dimension equal to one dimension of said front wall and having a dimension perpendicular to the first dimension substantially smaller than the first dimension, two of said side walls having rearward extensions of smaller width than said side walls and serving as side walls of the rear compartment, and the rear compartment having additional walls of the same dimension as said side walls cooperating with said extensions in defining a generally rectangular rear compartment space, one transverse dimension of which is substantially smaller than the corresponding dimension of the front compartment and the other transverse dimension of which is substantially equal to the corresponding dimension of the front compartment, the enclosure walls being at least in large part formed of thin sheet material capable of excitation and consequent sound vibration under the influence of the speaker at least at frequencies in the lower portion of the audio range, and a reflector in which the speaker and its enclosure are positioned, the reflector having an opening at the front through which the speaker is exposed, said opening being larger than the front compartment of the speaker enclosure to provide clearance at all sides of the speaker enclosure, the reflector having rearwardly converging side walls enclosing the speaker enclosure with clearance at the four lateral sides of both the front and rear compartments of the speaker enclosure.

2. Loudspeaker equipment as defined in claim 1 in which the reflector has side walls which are curved and positioned with the convex curvature presented outwardly.

3. Loudspeaker equipment as defined in claim 1 in which the reflector has side walls which are planar and positioned in rearwardly converging planes.

4. Loudspeaker equipment as defined in claim 2 in which the reflector has a top wall which is planar and positioned in spaced parallel relation to the top wall of the speaker enclosure.

5. Loudspeaker equipment as defined in claim 4 in which the curved side walls of the reflector converge rearwardly.

* * * * *